United States Patent [19]

Daimon et al.

[11] Patent Number: 5,107,111
[45] Date of Patent: Apr. 21, 1992

[54] SPHERICAL ELECTRODE TYPE CHARGED PARTICLE ANALYZER

[75] Inventors: Hiroshi Daimon, Yao; Shozo Ino, Tokyo, both of Japan

[73] Assignee: Shimadzu Corporation, Kyoto, Japan

[21] Appl. No.: 549,414

[22] Filed: Jul. 6, 1990

[30] Foreign Application Priority Data

Jan. 30, 1989 [JP] Japan .................................. 1-22135

[51] Int. Cl.⁵ ........................................... H01J 43/00
[52] U.S. Cl. .................................... 252/205; 250/309; 250/310
[58] Field of Search ......................... 250/305, 309, 310

[56] References Cited

U.S. PATENT DOCUMENTS

| | | | |
|---|---|---|---|
| 3,679,896 | 7/1972 | Wardly | 250/305 |
| 4,179,604 | 12/1979 | Christou | 250/305 |
| 4,849,629 | 7/1989 | Daimon et al. | 250/305 |

FOREIGN PATENT DOCUMENTS

| | | | |
|---|---|---|---|
| 78361 | 5/1983 | Japan | 250/305 |
| 221082 | 1/1990 | United Kingdom | 250/305 |

Primary Examiner—Bruce C. Anderson

[57] ABSTRACT

A charged particle analyzer comprises a spherical grid, a spherical electrode concentric with each other, an emission portion for emitting charged particles, a screen plate having an exit opening, a plurality of second spherical grids forming a high pass filter for the charged particles, a detector for detecting the charged particles, and an obstacle ring being in parallel with an equatorial plane normal to a line connecting the emission portion and the center of the exit opening and being within the spherical electrode.

2 Claims, 5 Drawing Sheets emission angle

SPHERICAL ELECTRODE TYPE CHARGED PARTICLE ANALYZER

BACKGROUND OF THE INVENTION

The present invention relates to an analyzer for analyzing the composition, structure, or electronic condition of a sample by measuring the kinetic energy of charged particles emitted from the sample and the angular distribution of the particles, and more particularly, to such an analyzer suitable for measuring the energy distribution of the charged particles emitted from the sample or the angular distribution of charged particles of particular energy to be noted from the surface of the sample in a two-dimensional manner.

Conventionally, to analyze the energy of charged particles from a sample, the energy is measured for the charged particles emitted within a particular small solid angle, so that the energy distribution of the charged particles in the direction is examined. The present inventors proposed an improved charged particle analyzer for measuring the angular distribution of the charged paraticles of a given kinetic energy emitted from a sample into a large solid angle, which was issued on Jul. 18, 1989, as a U.S. Pat. No. 4,849,629, entitled "CHARGED PARTICLE ANALYZER". That invention is described with reference to FIG. 1 showing a preferred embodiment of the present invention.

A spherical grid 1 has a center O. Concentric with the spherical grid 1, a spherical electrode 2 is disposed. A sample S is positioned within the spherical grid 1 and far from the spherical center of the spherical grid 1. A screen plate 3 is provided having an opening A symmetric with the sample S, with respect to the center of the spherical grid 1. A two-dimensional detector 4 is positioned within a space opposed to the spherical grid 1 as to the screen plate 3 and faced to the opening A. A suitable voltage is applied between the spherical grid 1 and the spherical electrode 2, then no electric field appears within the bottom space of the spherical grid 1.

When an excitation beam is incident on the sample S, the sample S emits charged particles. The emitted charged particles lineally travel at the bottom space of the spherical grid 1 from the incident portion of the exciting beam. They fly an elliptical orbit having one focus at O within the space between the spherical grid 1 and the spherical electrode 2. Some charged particles with too higher energy are eliminated by being struck with the spherical electrode 2. Some charged particles with lower energy can return to the bottom space of the spherical grid 1. Some charged particles having particular energy defined by a voltage applied between the spherical grid 1 and the spherical electrode 2 can transit through the opening A at the direction parallel with the direction of the emission of the charged particles from the sample S. This means that the charged particles transiting through the opening A all have the same energy, and the angular distribution of the charged particles is the same as the angular distribution of them at the time when they are emitted from the surface of the sample S. The output pictures of the twodimensional detector 4 represent the angular distribution of the charged particles with the particular energy.

The particular energy can be selected by the voltage applied between the spherical grid 1 and the spherical electrode 2.

Thus, the above-described analyzer can measure the angular distribution of the charged particles having the particular energy among the charged particles emitted from the excited portion on the surface of the sample S.

As apparent from the above description, the spherical grid 1 and the spherical electrode 2 do not conform any low pass filter. According to that invention, no energy filter, by which all of the charged particles having energy more than particular energy Ec are introduced into the spherical electrode 2 and all of the charged particles having energy less than energy Ec are reflected, is provided. Otherwise, the charged particles with the particular energy can be gathered into the opening A and transit it while the charged particles with the other energy are scattered over the screen plate 3 not to transit it. The selection of the charged particles in terms of the energy is done in this manner.

The resolution of the energy depends upon the position of the sample, from which the charged particles are emitted, the position and the largeness of the opening A. With a simulation using a computer, the transmittance of the charged particles with various kinetic energies through the opening A is calculated as a function of a deviation of energy as to the particular energy Eo ($\Delta E/Eo$), which results are shown in FIG. 6. The numerals in the graph of FIG. 6 represent 10 times a ratio of a distance s from the center O of the sample S and the opening A as compared to the radius a of the spherical grid 1, namely, $10 \times s/a$. When the ratio s/a is small, the transmittance shows that the analyzer is a low-pass filter. When the ratio s/a exceeds 0.5, the transmittance curve is symmetric. When the sample S and the opening A are far from the center O, the half value width of the transmittance is narrow. When the largeness of the opening A is 1% of the radius a of the spherical grid 1 and s/a=0.9, the resolution is about 1%, which is approximate to the resolution of the conventional spectrometer.

By the way, the disadvantage of this spectrometer is that the resolution is not uniform about the emission angle of the charged particles from the sample. Although the total transmittance over all of the emission angles is as illustrated in the graph of FIG. 6, the resolution at some angular region is better than the average value, and at some region it is worse than the average value. In particular, around the condition of emission angle $\theta = 90°$, the resolution is the worst as illustrated by the broken line of FIG. 4. In FIG. 4, the abscissa is the emission angle $\theta$ and the ordinate is a deviation of energy (%) from the energy (Eo) to be analyzed. In FIG. 4, assuming that the transmittance of the charged particles of the energy Eo is 1, the plotted data represent the energy of the charged particle having about one half of the transmittance. At the range of $\theta = 90° \sim 180°$, the data are about symmetric with respect to $\theta = 90°$, so that the transmittance of only $\theta = 0° \sim 90°$ is illustrated. The broken line data of FIG. 4 are given by the previous invention, indicating that around $\theta = 90°$, the resolution is very poor at the high energy side and the low energy side. In practice, around $\theta = 90°$, the S/N ratio is too bad to observe the pictures. In the graph of FIG. 6(b), both sides cannot reach zero promptly due to the poor resolution at this angular range. At the lower angle specified by arrow A in the graph of FIG. 4, the orbit of the charged particles collides with the outer spherical electrode 2, so that the resolution at the high energy side becomes good.

SUMMARY OF THE INVENTION

Accordingly, it is an object of the present invention to provide an improved charged particle analyzer for obtaining the high energy resolution over all of the directions of the emission of charged particles from the surface of a sample by eliminating the non-uniformity of the energy resolution dependent on the direction of the emission of charged particles from the surface of the sample in the previous proposal by the present inventors.

Briefly described, in accordance with the present invention, a spherical electrode is disposed outside of and concentric with a spherical grid. An emission portion for emitting charged particles is positioned within the spherical grid and close to the bottom line of the spherical grid. A screen plate is provided on a plane containing the spherical center of the spherical grid and the emission portion. The screen plate has an exit opening that is positioned to be symmetric with the position of the emission portion with respect to the spherical center of the spherical grid. At an opposite side of the screen plate to the spherical grid, some second spherical grids are disposed around the center of the exit opening, so that these spherical grids form a high pass filter for the charged particles. A detector for detecting the charged particles is positioned outside of these second spherical grids. An obstacle ring is provided in parallel with an equatorial plane which passes through the spherical center of the spherical electrode and is normal to a line connecting the emission portion and the center of the exit opening. The obstacle ring is within the spherical electrode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

Figure 1:
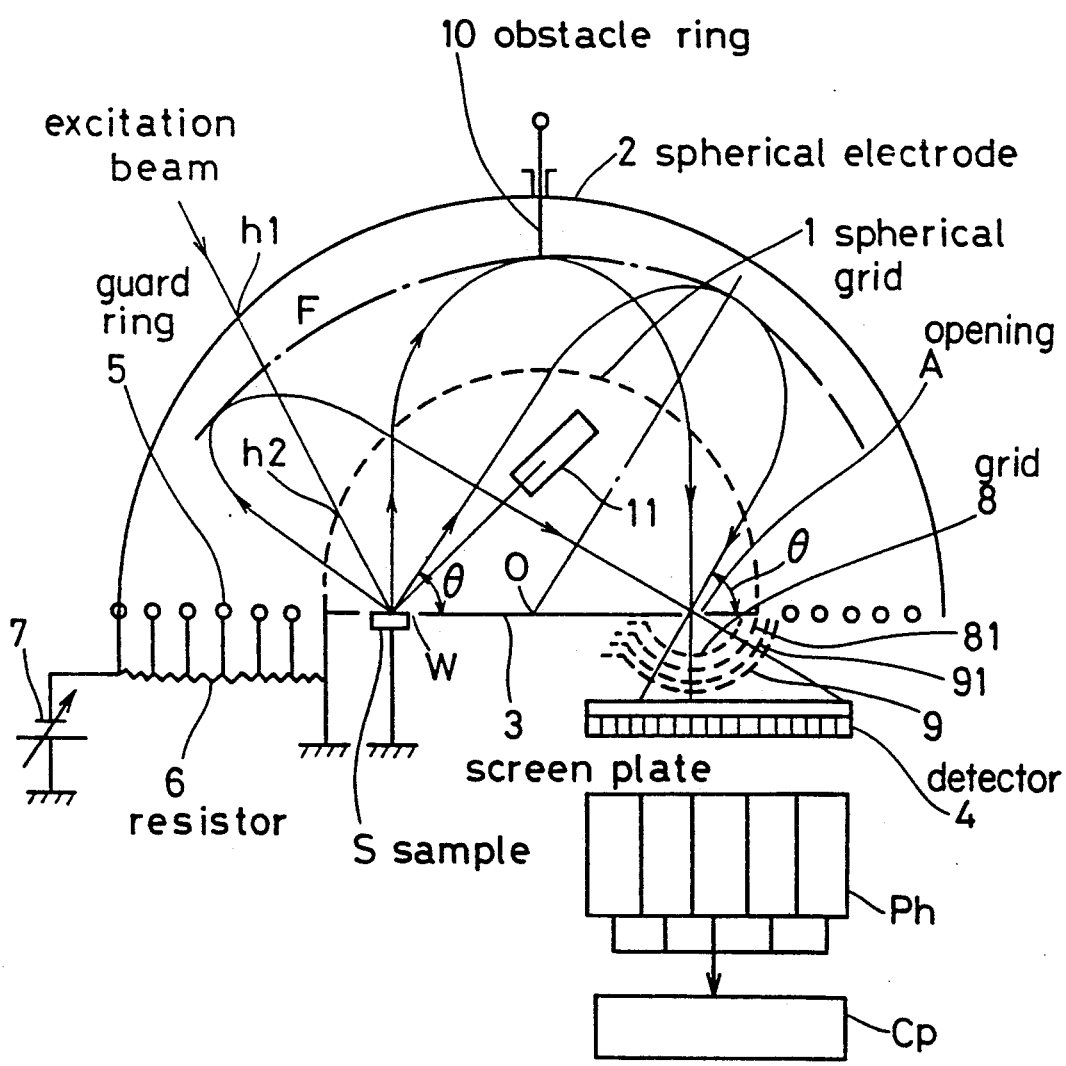
FIG. 1 shows a cross-sectional view of a spherical electrode type charged particle analyzer according to a preferred embodiment of the present invention.

FIG. 1 shows a preferred embodiment of a spherical electrode type charged particle analyzer of the present invention. A spherical grid 1 and a spherical electrode 2 are concentric having a common center of O. In this preferred embodiment, the radius of the spherical electrode 2 is twice the radius of the spherical grid 1. As far as the radius of the spherical electrode 2 is twice the radius of the spherical grid 1, in theory, the solid angle of detection is $2\pi$ steradian, which is the whole emission angle from sample surface. Guard rings 5 are provided between the edges of the spherical grid 1 and the spherical electrode 2. They are arranged in the concentric manner and connected to the resistor 6 as illustrated. One side of the resistor 6 is connected to the spherical grid 1 and is also grounded. The other side of the resistor 6 is connected to the spherical electrode 2 and is also connected to the power supply 7.

The guard rings 5 are provided for preventing the electric field between the spherical grid 1 and the spherical electrode 2 from being disturbed at the edges of the spherical grid 1 and the spherical electrode 2. A screen plate 3 is positioned at the bottom of the spherical grid 1, being made of an electrically conductive material and grounded. With the above-described structure, the energy of charged particles to be detected can be scanned by changing the output voltage of the power supply 7. The screen plate 3 has an entry window W, separated by a distance slightly smaller than the radius of the spherical grid 1 from the center O, for setting a sample S.

The screen plate 3 has an exit opening symmetrical with the position of the entry window W with respect to the center 0. Apertures $h_1$ and $h_2$ are bored in the spherical grid 1 and the spherical electrode 2, respectively, through which exciting beams such as X-rays for exciting the sample S are incident on the sample S. An electron gun 11 is positioned at a space between the spherical grid 1 and the screen plate 3 for emitting electron beams to the sample S. The sample S can be excited with the X-rays or the electron beams. A two-dimensional detector 4 is positioned below the screen plate 3 and faced against the exit opening A. The two-dimensional detector 4 composed of microchannel plates and a fluorescent plate. The light emitted from the fluorescent plate is detected with a two-dimensional photomultiplier Ph, so that the output is processed with a computer Cp to calculate the emission points on the fluorescent plate. By recording the emission points two-dimensionally, the angular distribution of the charged particles emitted from the sample S and having the characteristic energy as defined by the voltage applied between the spherical electrode 2 and the spherical grid 1 is represented. Four-fold spherical grids 8, 81, 91, and 9 are provided between the exit opening A and the two-dimensional detector 4. They are concentric at a center of the exit opening A. The potential of the innermost grid 8 is the same as that of the screen plate 3. The grids 81 and 91 are set to a slightly lower voltage than the energy of the charged particles to be detected, so that the charged particle having energy lower than the specific energy to be detected are blocked. The voltage of the outermost grid 9 is set, so that the charged particles being incident upon the two-dimensional detector 4 are accelerated. An obstacle ring 10 is a ring-like plate which is axially symmetric around the axis OA, and positioned in an equatorial plane passing through the spherical center O of the spherical electrode 2 and normal to the axis OA. The obstacle ring 10 is isolated from the spherical electrode 2 and is set to a voltage identical with the normal potential between the spherical grid 1 and the spherical electrode 2 at the internal peripheral edges. Here, the potential adjacent the portion where the obstacle ring 10 penetrates the spherical electrode 2 is disturbed, but the potentials within the spherical electrode 2 as a whole are not disturbed. The orbits of the charged particles are not changed as the case without the obstacle ring 10. The charged particles having the energy higher than the particular energy among the charged particles emitted from the sample S in the normal direction are obstacled by the obstacle ring 10.

The orbits of the charged particles finally going into the exit opening A are the same regardless of setting the particular energy, as shown in FIG. 1. Then the inner radius of the obstacle ring 10 can be fixed while the applied voltage should be changed in proportion to the voltage applied to the spherical electrode 2.

Figure 2:
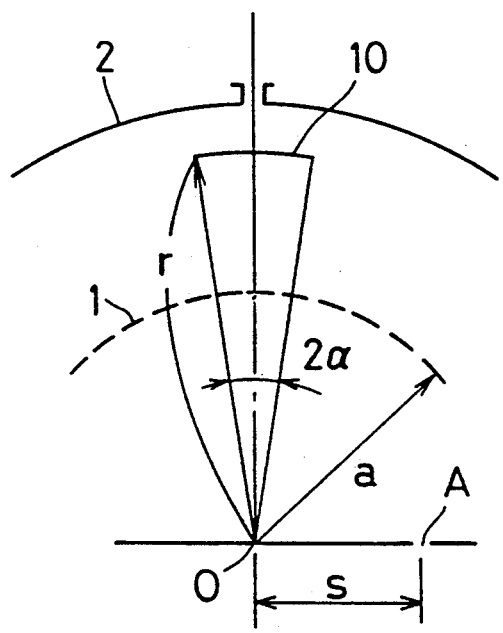
FIG. 2 shows a cross-sectional view of another example of an obstacle ring used for the analyzer of the present invention.
Figure 4:
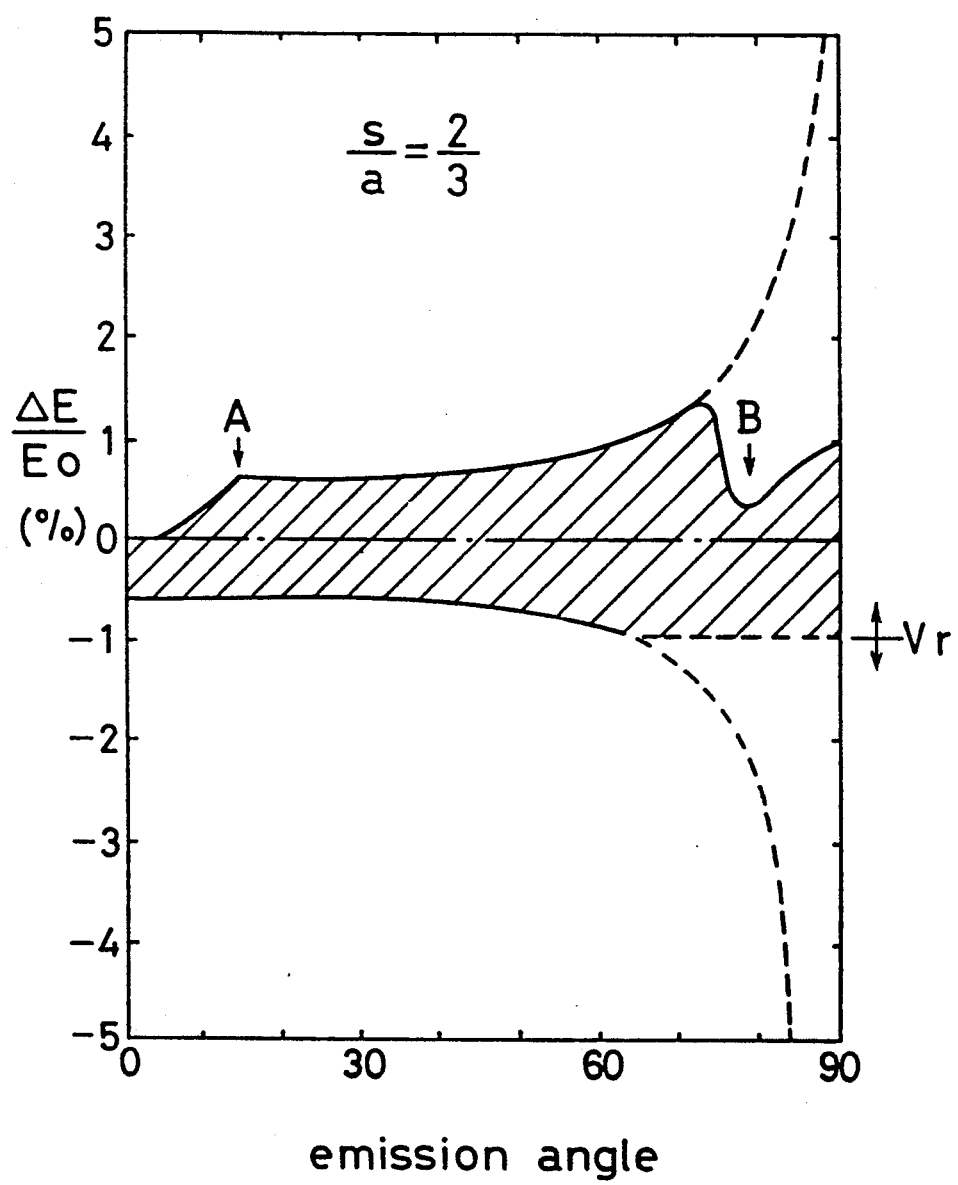
FIG. 4 shows a graph of a relation between the emission direction and the energy resolution when the obstacle ring as shown in FIG. 2 is applied to the analyzer of the present invention.

FIG. 2 shows a more efficient shape of the obstacle ring 10, in which the obstacle ring 10 is shaped as a partial sphere having an angle of $2\alpha$ around the center O of the spherical electrode 2. FIG. 4 shows a graph of the energy resolution according to the emission direction of the charged particles when the obstacle ring of FIG. 2 is applied. The radius a of the spherical grid 1 is set 1.5 times the distance s from the center O to the exit opening A (s/a=$\frac{2}{3}$) and the radius r and half angle $\alpha$ of the obstacle ring 10 is set to r=1.7613a, $\alpha$=10.92° in the case of FIG. 4. The broken line of FIG. 4 indicates the resolution data without the obstacle ring 10. In this example, the maximum point of the resolution appears around 80° (10° inclination from the normal) and it is a small problem about the uniformity resolution. This maximum point of the resolution is due to the effect at the edges of the obstacle ring 10.

Figure 3:
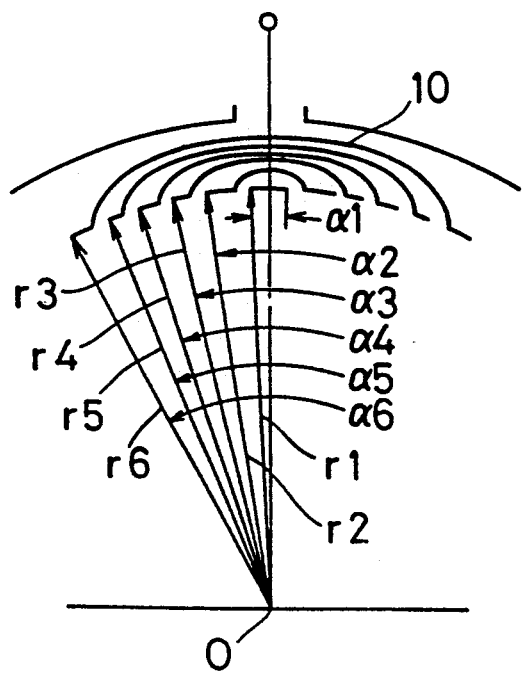
FIG. 3 shows a cross-sectional view of still another example of the obstacle ring.
Figure 5:
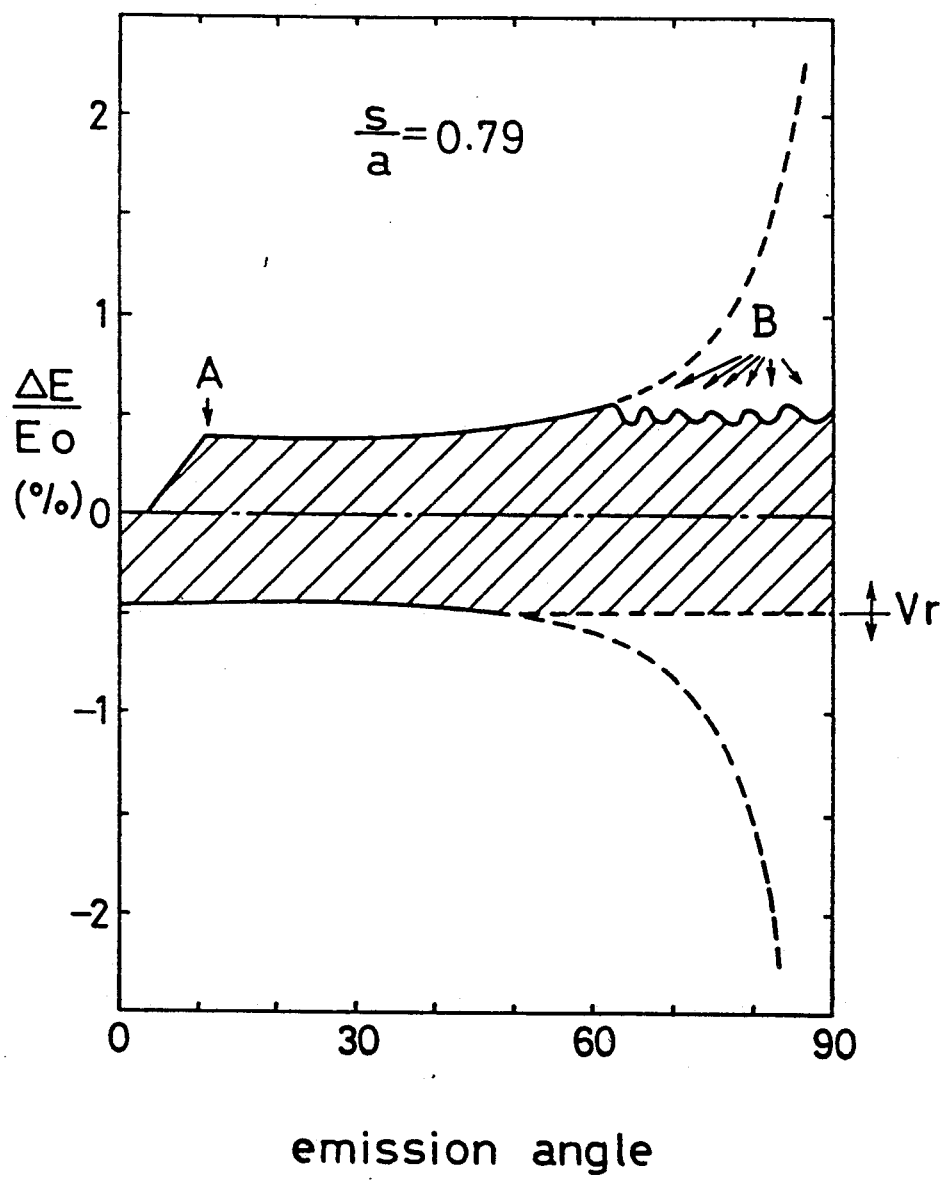
FIG. 5 shows a graph of a relation between the emission direction and the energy resolution when the obstacle ring as shown in FIG. 3 is applied to the analyzer of the present invention.
Figure 6A:
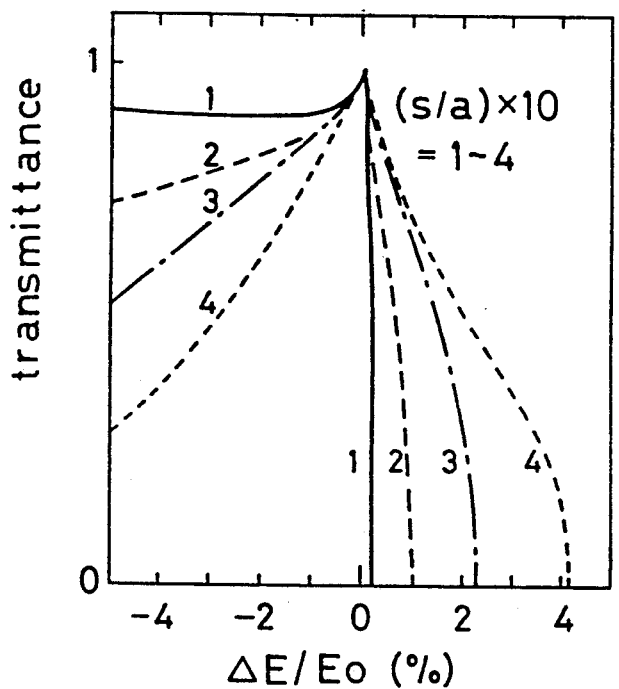
FIG. 6 ($a$–$b$) are graphs of the overall transmittance.
Figure 6B:
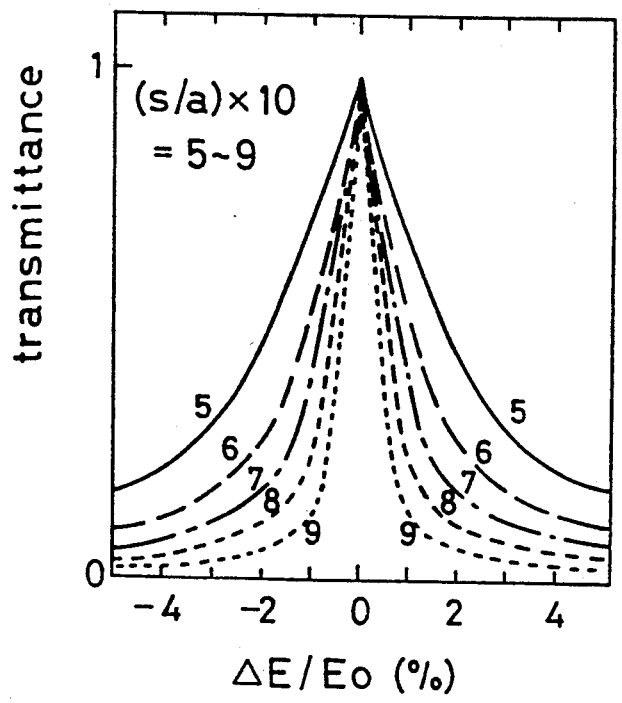

To resolve this problem, as shown in FIG. 3, a plurality of rings having different radii r from each other a little are provided. FIG. 5 shows a graph of using six obstacle rings to make the resolution approximately uniform. In this example, to obtain the resolution of ±0.5%, s/a=0.79 and (r, $\alpha$)=(1.6222a, 2°), (1.63026a, 6°), (1.64386a, 10°), (1.66255a, 14°), (1.68173a, 18°), and (1.70389a, 22°). Then, the large dip of FIG. 4 can be eliminated and 6 small dips are present, so that approximately uniform resolution can be given.

As described above, in the charged particle analyzer as illustrated in FIG. 1, the envelope plane of the orbits of the charged particles with the specific energy emitted from the emission point of the sample into the exit opening A is not a sphere having the center O of the spheric electrode 2, but a shape in which the upright direction of the center O is down compared to the sphere. Therefore, the orbits of the charged particles having the more energy than the specific energy is out of that envelope plane. When attention is directed to the particular charged particle emitted from the sample in the vertical direction and down to the exit opening A in a direction normal to the screen plate 3, the energy resolution of such a charged particle is the lowest as shown in the broken line of FIG. 4. The charged particles having the energy more than the particular energy are obstacled by colliding with the obstacle ring 10, so that they cannot pass through the exit opening A. When the interruption energy of high-pass filter of the spherical grids positioned below the exit opening A is set slightly lower than the above particular energy, the charged particles having the energy lower than the particular energy, which cannot be removed by the obstacle ring, can be removed. Hence, the energy resolution of the charged particles in this direction can be improved, so that the energy resolution is uniform in all directions.

Although the above description is exemplified about the angular distribution of the charged particles having the particular energy emitted from the sample, the present invention is evidently applied to measure tha energy distribution of the charged particles emitted to a particular direction from the sample or measure the energy distribution of all the charged particles emitted. While only certain embodiments of the present invention have been described, it will be apparent to those skilled in the art that various changes and modifications may be made therein without departing from the spirit and scope of the present invention as claimed.

What is claimed is:

1. A charged particle analyzer comprising:
   a spherical grid which is grounded;
   a spherical electrode disposed outside and concentric with said spherical grid, the spherical electrode having a negative potential, the spherical grid and spherical electrode having a predetermined potential therebetween;
   an emission portion positioned within said spherical grid and close to the bottom line of said spherical grid for emitting charged particles;
   an exit opening provided on a plane containing the spherical center of said spherical grid and said emission portion, said exit opening being positioned to be symmetrical with the position of said emission portion with respect to the spherical center of said spherical grid;
   a plurality of second spherical grids disposed around the center of said exit opening at an opposite side to the side containing said spherical grid;
   said plurality of spherical grids forming a high pass filter for said charged particles;
   a detector positioned outside said plurality of second spherical grids for detecting said charged particles; and
   an obstacle ring provided generally parallel with an equatorial plane normal to a line connecting said emission portion and the center of the exit opening and being within said spherical electrode, the obstacle ring having a voltage set identical to the predetermined potential between the spherical grid and the spherical electrode.

2. The charged particle analyzer as set forth in claim 1, wherein said obstacle ring prevents the charged particle with higher energy than a particular energy from traveling so as not to enter said exit opening, and said plurality of second spherical grids having an interruption energy slightly lower than the particular energy serve to remove the charged particles having lower energy than the particular energy, so that the energy resolution can be enhanced.

* * * * *